(12) United States Patent (10) Patent No.: US 11,886,674 B2
Lee et al. (45) Date of Patent: Jan. 30, 2024

(54) TOUCH DISPLAY APPARATUS

(71) Applicant: LG Display Co., Ltd., Seoul (KR)

(72) Inventors: Hwi Deuk Lee, Paju-si (KR); Yang Sik Lee, Paju-si (KR); Sang Hyuck Bae, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/556,864

(22) Filed: Dec. 20, 2021

(65) Prior Publication Data

US 2022/0206633 A1 Jun. 30, 2022

(30) Foreign Application Priority Data

Dec. 31, 2020 (KR) .................. 10-2020-0189505

(51) Int. Cl.
*G06F 3/041* (2006.01)
*G06F 3/044* (2006.01)
*H10K 50/844* (2023.01)
*H10K 59/40* (2023.01)
*H10K 59/122* (2023.01)

(52) U.S. Cl.
CPC ......... *G06F 3/0445* (2019.05); *H10K 50/844* (2023.02); *H10K 59/122* (2023.02); *H10K 59/40* (2023.02); *G06F 2203/04111* (2013.01)

(58) Field of Classification Search
CPC ......... G06F 3/0445; G06F 2203/04111; G06F 3/0412; G06F 3/04164; G06F 3/0446
See application file for complete search history.

(56) References Cited

U.S. PATENT DOCUMENTS

| 10,332,943 | B2 | 6/2019 | Seo et al. |
| 10,627,966 | B2 | 4/2020 | Na |
| 11,073,928 | B2 | 7/2021 | Lee et al. |
| 11,315,986 | B2 | 4/2022 | Kim et al. |
| 2017/0160852 | A1 | 6/2017 | Ahn et al. |
| 2020/0150826 | A1 | 5/2020 | Hwang |
| 2020/0241664 | A1 | 7/2020 | Lee et al. |
| 2022/0066595 | A1* | 3/2022 | Kang .............. G06F 3/0443 |
| 2022/0066613 | A1* | 3/2022 | Yuan .............. H01L 27/3276 |

FOREIGN PATENT DOCUMENTS

| KR | 10-2014-0060966 A | 5/2014 |
| KR | 10-2015-0144258 A | 12/2015 |
| KR | 10-1617140 B1 | 5/2016 |
| KR | 10-2017-0067093 A | 6/2017 |
| KR | 10-2018-0025774 A | 3/2018 |

(Continued)

*Primary Examiner* — Dennis P Joseph
(74) *Attorney, Agent, or Firm* — Seed IP Law Group LLP (57) ABSTRACT

A touch display apparatus senses a touch of a user and/or a tool. In the touch display apparatus, an upper electrode of each light-emitting device may include a first electrode region overlapping with an emission area and a second electrode region being spaced away from the first electrode region. The second electrode region may be connected to a link wire different from the first electrode region. Thus, in the touch display apparatus, at least one of the first electrode region and the second electrode region of each upper electrode may be used for sensing the touch of the user and/or the tool. Therefore, in the touch display apparatus, a process of forming components for sensing the touch may be simplified.

18 Claims, 5 Drawing Sheets

(56) References Cited

FOREIGN PATENT DOCUMENTS

| KR | 10-2018-0043528 A | 4/2018 |
| KR | 10-2018-0059035 A | 6/2018 |
| KR | 10-2020-0037760 A | 4/2020 |
| KR | 10-2020-0054412 A | 5/2020 |
| KR | 10-2020-0057981 A | 5/2020 |
| KR | 10-2020-0094896 A | 8/2020 |

* cited by examiner

TOUCH DISPLAY APPARATUS

CROSS-REFERENCE TO RELATED APPLICATION(S)

This application claims the benefit of Korean Patent Application No. 10-2020-0189505 filed on Dec. 31, 2020, which is hereby incorporated by reference as if fully set forth herein.

BACKGROUND

Technical Field

The present disclosure relates to a touch display apparatus sensing a user and/or a tool.

Description of the Related Art

Generally, an electronic appliance, such as a monitor, a TV, a laptop computer and a digital camera, includes a display apparatus capable of realizing an image. For example, the display apparatus may include light-emitting devices. Each of the light-emitting devices may emit light displaying a specific color. For example, each of the light-emitting devices may include a light-emitting layer disposed between two emission electrodes.

The display apparatus may be a touch display apparatus which senses a touch of a user and/or a tool, and applies a specific signal. For example, the touch display apparatus may include touch electrodes which are disposed on the light-emitting devices. The touch electrodes may be disposed side by side on an encapsulating element covering the light-emitting devices. Thus, in the touch display apparatus, a touch signal by a touch driving part may be applied to each touch electrode through one of touch links, which extend along a surface of the encapsulating element. Therefore, in the touch display apparatus, a process may be complicated, and an area of a bezel area disposed outside a display area in which the light-emitting devices are arranged may be increased.

BRIEF SUMMARY

Accordingly, the present disclosure is directed to a touch display apparatus that substantially obviates one or more problems due to limitations and disadvantages of the related art.

A benefit of the present disclosure is to provide a touch display apparatus in which a process of forming a component for sensing a touch of a user and/or a tool is simplified.

Another benefit of the present disclosure is to provide a touch display apparatus capable of minimizing or reducing an area of a bezel.

Additional advantages and features of the disclosure will be set forth in part in the description which follows and in part will become apparent to those having ordinary skill in the art upon examination of the following or may be learned from practice of the disclosure. The features and other advantages of the disclosure may be realized and attained by the structure particularly pointed out in the written description and claims hereof as well as the appended drawings.

To achieve these benefits and other advantages and in accordance with the purpose of the disclosure, as embodied and broadly described herein, there is provided a touch display apparatus comprising a device substrate. The device substrate includes an emission area. A pixel electrode and a bank insulating layer are disposed on the device substrate. The pixel electrode is disposed on the emission area of the device substrate. The bank insulating layer covers an edge of the pixel electrode. A light-emitting layer is disposed on a portion of the pixel electrode, which is exposed by the bank insulating layer. An upper electrode is disposed on the bank insulating layer and the light-emitting layer. The upper electrode includes a first electrode region and a second electrode region. The first electrode region includes a portion overlapping with the light-emitting layer. The second electrode region is separated from the first electrode region. An encapsulating element is disposed on the upper electrode. A first link wire is disposed between the device substrate and the bank insulating layer. The first link wire is electrically connected to the first electrode region. A second link wire being spaced away from the first link wire is electrically connected to a second electrode region.

A separating partition may be disposed on the bank insulating layer. The separating partition may have a side of reverse taper. The separating partition may be disposed between the first electrode region and the second electrode region of the upper electrode.

The separating partition may surround the emission area.

The first electrode region of the upper electrode may have a larger size than the emission area of the device substrate.

The second electrode region may include the same material as the first electrode region.

The second link wire may be disposed between the device substrate and the bank insulating layer. The first link wire and the second link wire may include the same material.

A signal wire being insulated from the upper electrode may be spaced away from the first link wire and the second link wire. The signal wire may include a portion overlapping with the second electrode region.

The signal wire may be disposed on the same layer as the first link wire.

In another embodiment of the present disclosure, a touch display apparatus includes a device substrate. A bank insulating layer is disposed on the device substrate. The bank insulating layer defines (e.g., laterally surrounds) emission areas. Each of pixel electrodes is disposed on one of the emission areas of the device substrate. Each of light-emitting layers is disposed on one of the pixel electrodes. Upper electrodes are disposed on the bank insulating layer and the light-emitting layers. The upper electrodes are arranged side by side in a first direction and a second direction. The second direction is a direction perpendicular to the first direction. An encapsulating element is disposed on the upper electrodes. First link wires and second link wires are disposed between the device substrate and the bank insulating layer. The first link wires extend in the first direction. The second link wires are spaced away from the first link wires. The second electrode region of each upper electrode is connected to one of the second link wires.

The second link wires may extend parallel to the first link wires. The first link wires and the second link wires may be disposed outside the emission areas.

The upper electrodes may include first upper electrodes in which the second electrode region is connected in the first direction by first bridge electrodes, and second upper electrodes in which the second electrode region is connected in the second direction by second bridge electrodes. The first bridge electrodes and the second bridge electrodes may be disposed outside the emission areas. Each of the second bridge electrodes may cross one of the first bridge electrodes.

The second link wires may include first wire lines being connected to the second electrode region of each first upper electrode and second wire lines being connected to the second electrode region of each second upper electrodes.

The second bridge electrodes may be disposed on the same layer as the first link wires and the second link wires.

The second bridge electrodes may include the same material as the first link wires and the second link wires.

Each of the first upper electrodes may be in direct contact with one of the first bridge electrodes.

In another embodiment, a touch display apparatus includes a device substrate. A light-emitting device is on an emission area of the device substrate. A first bridge electrode has the same material as a first electrode region of an upper electrode. The first electrode region includes a portion overlapping a light-emitting layer of the light-emitting device, and is separated from the first bridge region by at least one separating partition. A second bridge electrode overlaps the first bridge electrode, and is positioned between the first bridge electrode and the device substrate. A first link wire is electrically connected to the first electrode region, and is disposed on the same layer as the second bridge electrode.

BRIEF DESCRIPTION OF THE SEVERAL
VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Hereinafter, details related to the above technical features and benefits, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical spirit of the present disclosure to be satisfactorily transferred to those skilled in the art, and thus the present disclosure may be embodied in other forms and is not limited to the embodiments described below.

In addition, the same or highly similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing from the technical spirit of the present disclosure.

The terms used in the specification of the present disclosure are used in order to describe particular embodiments, and are not intended to limit the scope of the present disclosure. For example, an element described in the singular form is intended to include the meaning of a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 1:
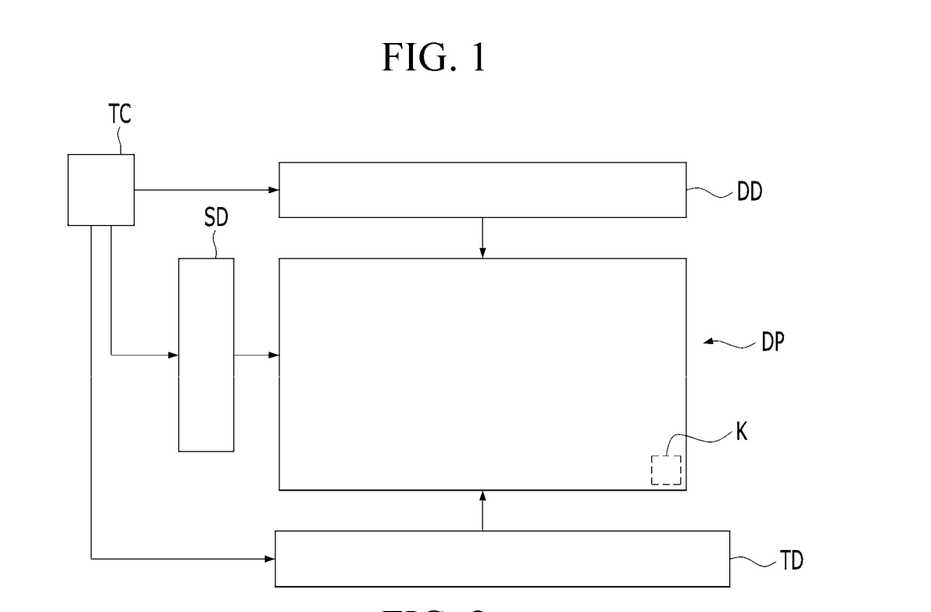
FIG. 1 is a view schematically showing a touch display apparatus according to an embodiment of the present disclosure.
Figure 2:
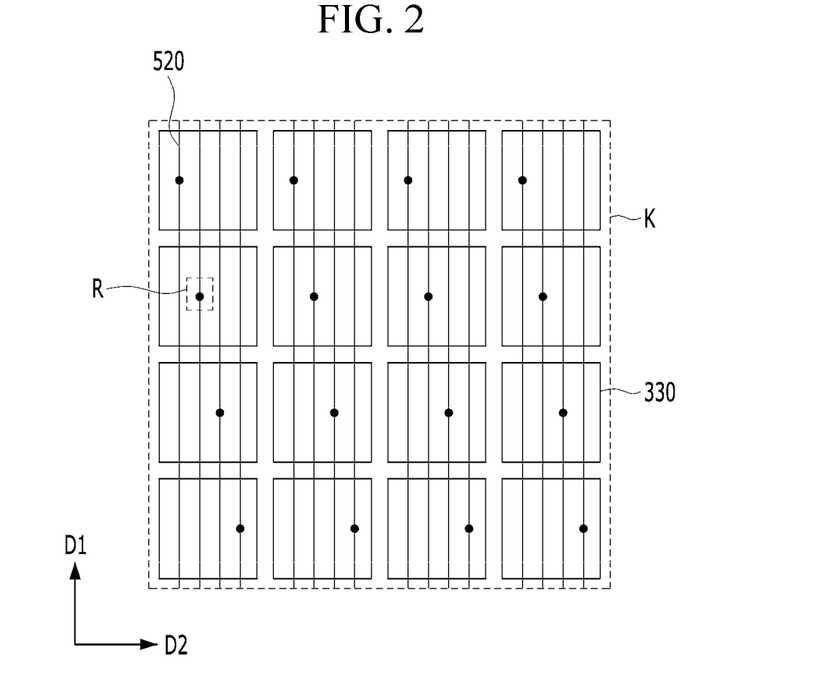
FIG. 2 is an enlarged view of K region in FIG. 1.
Figure 3:
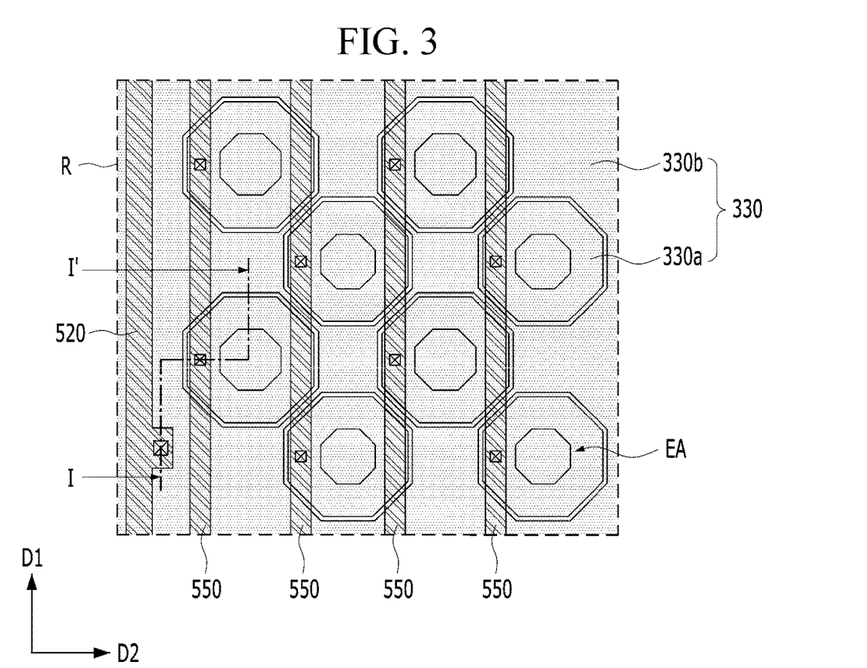
FIG. 3 is an enlarged view of R region in FIG. 2.
Figure 4:
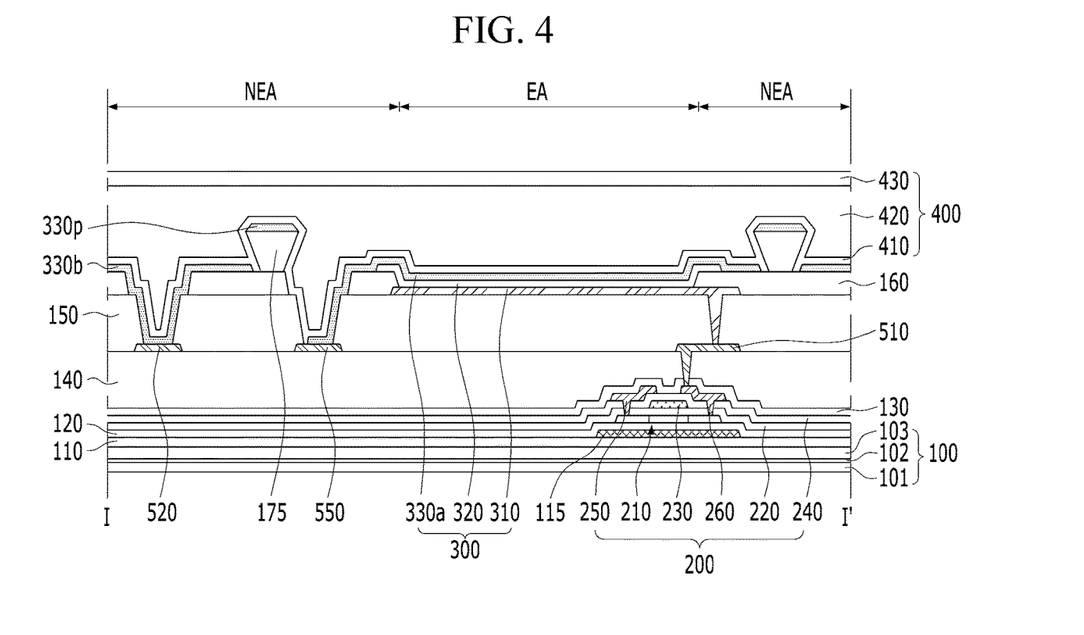
FIG. 4 is a view taken along I-I' of FIG. 3.

FIG. 1 is a view schematically showing a touch display apparatus according to an embodiment of the present disclosure. FIG. 2 is an enlarged view of K region in FIG. 1. FIG. 3 is an enlarged view of R region in FIG. 2. FIG. 4 is a view taken along I-I' of FIG. 3.

Referring to FIGS. 1 to 4, the touch display apparatus according to the embodiment of the present disclosure may include a display panel DP and driving parts or circuits DD, SD, TD and TC. The driving parts DD, SD, TD and TC may provide various signals for realizing an image to the display panel DP. For example, the driving parts DD, SD, TD and TC may include a data driver DD applying a data signal, a scan driver SD applying a scan signal and a timing controller TC. The timing controller TC may apply a digital video data and a source timing control signal to the data driver DD, and apply clock signals, reverse clock signals and start signals to the scan driver SD.

The display panel DP may generate an image provided to a user. For example, the display panel DP may include light-emitting devices 300 on a device substrate 100. The device substrate 100 may have a multi-layer structure, as illustrated in FIG. 4. For example, the device substrate 100 may have a stacked structure of a first substrate layer 101, a substrate insulating layer 102 and a second substrate layer 103. The second substrate layer 103 may include the same material as the first substrate layer 101. For example, the first substrate layer 101 and the second substrate layer 103 may include a polymer material, such as poly-imide (PI). The substrate insulating layer 102 may include an insulating material. Thus, in the touch display apparatus according to the embodiment of the present disclosure, the device substrate 100 may have high flexibility. Therefore, in the touch display apparatus according to the embodiment of the present disclosure, the damage of the light-emitting devices 300 due to an external impact may be prevented.

The device substrate 100 may include emission areas EA and a non-emission area NEA. The non-emission area NEA may be disposed outside the emission areas EA. For example, each of the emission areas EA may be surrounded by (e.g., laterally surrounded by) the non-emission area NEA.

Driving circuits may be disposed on the device substrate 100. Each of the driving circuits may be electrically connected to one of the light-emitting devices 300. Each of the driving circuits may be controlled by signals transmitted from the driving parts DD, SD, TD and TC. For example, each of the driving circuits may provide a driving current corresponding the data signal to the corresponding light-emitting device 300 according to the scan signal. Each of the driving circuits may include at least one thin film transistor 200. For example, the thin film transistor 200 may include a semiconductor pattern 210, a gate insulating layer 220, a gate electrode 230, an interlayer insulating layer 240, a source electrode 250 and a drain electrode 260.

The semiconductor pattern 210 may include a semiconductor material. For example, the semiconductor pattern 210 may include amorphous silicon (a-Si) or polycrystalline silicon (poly-Si). The semiconductor pattern 210 may be an oxide semiconductor. For example, the semiconductor pattern 210 may include a metal oxide, such as indium gallium zinc oxide (IGZO). The semiconductor pattern 210 may include a source region, a drain region and a channel region. The channel region may be disposed between the source region and the drain region. The source region and the drain region may have a lower resistance than the channel region.

The gate insulating layer 220 may be disposed on the semiconductor pattern 210. The gate insulating layer 220 may extend beyond the semiconductor pattern 210. For example, a side of the semiconductor pattern 210 may be covered by the gate insulating layer 220. The gate insulating layer 220 may include an insulating material. For example, the gate insulating layer 220 may include silicon oxide (SiO) and/or silicon nitride (SiN). The gate insulating layer 220 may include a material having a high dielectric constant. For example, the gate insulating layer 220 may include a high-K material, such as hafnium oxide (HfO). The gate insulating layer 220 may have a multi-layer structure.

The gate electrode 230 may be disposed on the gate insulating layer 220. The gate electrode 230 may include a conductive material. For example, the gate electrode 230 may include a metal, such as aluminum (Al), titanium (Ti), copper (Cu), chrome (Cr), molybdenum (Mo) and tungsten (W). The gate electrode 230 may be insulated from the semiconductor pattern 210 by the gate insulating layer 220. The gate electrode 230 may overlap the channel region of the semiconductor pattern 210. For example, the channel region of the semiconductor pattern 210 may have electrical conductivity corresponding to a voltage applied to the gate electrode 230.

The interlayer insulating layer 240 may be disposed on the gate electrode 230. The interlayer insulating layer 240 may extend beyond the gate electrode 230. For example, a side of the gate electrode 230 may be covered by the interlayer insulating layer 240. The interlayer insulating layer 240 may be in direct contact with the gate insulating layer 220 at the outside of the gate electrode 230. The interlayer insulating layer 240 may include an insulating material. For example, the interlayer insulating layer 240 may include silicon oxide (SiO).

The source electrode 250 may be disposed on the interlayer insulating layer 240. The source electrode 250 may include a conductive material. For example, the source electrode 250 may include a metal, such as aluminum (Al), titanium (Ti), copper (Cu), chrome (Cr), molybdenum (Mo) and tungsten (W). The source electrode 250 may be insulated from the gate electrode 230 by the interlayer insulating layer 240. For example, the source electrode 250 may include a material different from the gate electrode 230. The source electrode 250 may be electrically connected to the source region of the semiconductor pattern 210. For example, the gate insulating layer 220 and the interlayer insulating layer 240 may include a source contact hole partially exposing the source region of the semiconductor pattern 210. The source electrode 250 may include a portion overlapping with the source region of the semiconductor pattern 210. For example, the source electrode 250 may be in direct contact with the source region of the semiconductor pattern 210 within the source contact hole.

The drain electrode 260 may be disposed on the interlayer insulating layer 240. The drain electrode 260 may include a conductive material. For example, the drain electrode 260 may include a metal, such as aluminum (Al), titanium (Ti), copper (Cu), chrome (Cr), molybdenum (Mo) and tungsten (W). The drain electrode 260 may be insulated from the gate electrode 230 by the interlayer insulating layer 240. For example, the drain electrode 260 may include a material different from the gate electrode 230. The drain electrode 260 may include the same material as the source electrode 250. The drain electrode 260 may be electrically connected to the drain region of the semiconductor pattern 210. The drain electrode 260 may be spaced away from the source electrode 250. For example, the gate insulating layer 220 and the interlayer insulating layer 240 may include a drain contact hole partially exposing the drain region of the semiconductor pattern 210. The drain electrode 260 may include a portion overlapping with the drain region of the semiconductor pattern 210. For example, the drain electrode 260 may be in direct contact with the drain region of the semiconductor pattern 210 within the drain contact hole.

A first buffer layer 110 may be disposed between the device substrate 100 and the driving circuits. The first buffer layer 110 may prevent pollution due to the device substrate 100 in a process of forming the thin film transistors 200. For example, the first buffer layer 110 may completely cover an upper surface of the device substrate 100 toward the light-emitting devices 300. The first buffer layer 110 may include an insulating material. For example, the first buffer layer 110 may include silicon oxide (SiO) and/or silicon nitride (SiN). The first buffer layer 110 may have a multi-layer structure.

A light-blocking pattern 115 may be disposed between the first buffer layer 110 and each thin film transistor 200. The light-blocking pattern 115 may prevent characteristics change of each thin film transistor 200 due to external light. For example, the light-blocking pattern 115 may include a portion overlapping with the semiconductor pattern 210 of each thin film transistor 200. The light-blocking pattern 115 may include a material that blocks or absorbs the light. For example, the light-blocking pattern 115 may include a metal, such as aluminum (Al), silver (Ag) and copper (Cu).

The light-blocking pattern 115 may be insulated from the semiconductor pattern 210 of each thin film transistor 200. For example, a second buffer layer 120 may be disposed between the light-blocking pattern 115 and the thin film transistors 200. The second buffer layer 120 may include an insulating material. For example, the second buffer layer 120 may include silicon oxide (SiO) or silicon nitride (SiN). The second buffer layer 120 may include the same material as the first buffer layer 110. The second buffer layer 12 may extend beyond the light-blocking pattern 115. For example, the second buffer layer 120 may be in direct contact with the first buffer layer 110 at the outside of the light-blocking pattern 115.

A lower passivation layer 130 may be disposed on the driving circuits. The lower passivation layer 130 may prevent the damage of the driving circuits due to the external impact and moisture. For example, an upper surface of each thin film transistor 200 opposite to the device substrate 100 may be covered by the lower passivation layer 130. The lower passivation layer 130 may include an insulating material. For example, the lower passivation layer 130 may include an inorganic insulating material, such as silicon oxide (SiO) and silicon nitride (SiN).

A lower planarization layer 140 and an upper planarization layer 150 may be sequentially stacked on the lower passivation layer 130. The lower planarization layer 140 and the upper planarization layer 150 may remove a thickness difference due to the driving circuits. For example, an upper surface of the upper planarization layer 150 toward the light-emitting devices 300 may be a flat surface. The lower planarization layer 140 and the upper planarization layer 150 may include an insulating material. For example, the lower planarization layer 140 and the upper planarization layer 150 may include organic insulating material. The upper planarization layer 150 may include a material different from the lower planarization layer 140. Thus, in the touch display apparatus according to the embodiment of the present disclosure, the thickness difference due to the driving circuits may be effectively removed.

The light-emitting devices 300 may be disposed on the upper planarization layer 150. Each of the light-emitting devices 300 may emit light displaying a specific color. For example, each of the light-emitting devices 300 may include a pixel electrode 310, a light-emitting layer 320 and an upper electrode 330, which are sequentially stacked on the upper planarization layer 150.

The pixel electrode 310 may include a conductive material. The pixel electrode 310 may have a high reflectance. For example, the pixel electrode 310 may include a metal, such as aluminum (Al) and silver (Ag). The pixel electrode 310 may have a multi-layer structure. For example, the pixel electrode 310 may have a structure in which a reflective electrode formed of a metal is disposed between transparent electrodes formed of a transparent conductive material, such as ITO and IZO.

The light-emitting layer 320 may generate light having luminance corresponding to a voltage difference between the pixel electrode 310 and the upper electrode 330. For example, the light-emitting layer 320 may include an emission material layer (EML) including an emission material. The emission material may include an organic material, an inorganic material or a hybrid material. For example, the touch display apparatus according to the embodiment of the present disclosure may be an organic light-emitting display apparatus including the emission material layer formed of an organic material. The light-emitting layer 320 may have a multi-layer structure. For example, the light-emitting layer 320 may include at least one of a hole injection layer (HIL), a hole transmitting layer (HTL), an electron transmitting layer (ETL) and an electron injection layer (EIL). Thus, in the touch display apparatus according to the embodiment of the present disclosure, the luminous efficiency of each light-emitting devices 300 may be increased.

The upper electrode 330 may include a conductive material. The upper electrode 330 may include a material different from the pixel electrode 310. The upper electrode 330 may have a higher transmittance than the pixel electrode 310. For example, the upper electrode 330 may be a transparent electrode formed of a transparent conductive material, such as ITO and IZO. Thus, in the touch display apparatus according to the embodiment of the present disclosure, the light generated from the light-emitting layer 320 may be emitted to the outside through the upper electrode 330.

The light-emitting devices 300 may overlap the emission areas EA of the device substrate 100. For example, the pixel electrode 310, the light-emitting layer 320 and the upper electrode 330 of each light-emitting device 300 may be stacked on one of the emission areas EA. A bank insulating layer 160 may be disposed on the upper planarization layer 150. The bank insulating layer 160 may include an insulating material. For example, the bank insulating layer 160 may include an organic insulating material. The bank insulating layer 160 may include a material different from the lower planarization layer 140 and the upper planarization layer 150. The bank insulating layer 160 may define (e.g., laterally surround) the emission areas EA. For example, the bank insulating layer 160 may cover an edge of the pixel electrode 310 of each light-emitting device 300. The light-emitting layer 320 and the upper electrode 330 of each light-emitting device 300 may be stacked on a portion of the corresponding pixel electrode 310 exposed by the bank insulating layer 160. The non-emission area NEA of the device substrate 100 may overlap the bank insulating layer 160.

The pixel electrode 310 of each light-emitting device 300 may be electrically connected to one of the thin film transistors 200. Intermediate electrodes 510 may be disposed between the lower planarization layer 140 and the upper planarization layer 150. The intermediate electrodes 510 may include a conductive material. For example, the intermediate electrodes 510 may include a metal, such as aluminum (Al), titanium (Ti), copper (Cu), chrome (Cr), molybdenum (Mo) and tungsten (W). Each of the intermediate electrodes 510 may be electrically connected to the drain electrode 260 of one of the thin film transistors 200 by penetrating the lower planarization layer 140. For example, the pixel electrode 310 of each light-emitting device 300 may be connected to the corresponding thin film transistor 200 through the one of the intermediate electrodes 510. Each of the intermediate electrodes 510 may include a portion overlapping with the drain electrode 260 of one of the thin film transistors 200 and a portion overlapping with the pixel electrode 310 of one of the light-emitting devices 300. For example, the pixel electrode 310 of each light-emitting device 300 may be connected to the corresponding intermediate electrode 510 by penetrating the upper planarization layer 150.

The light emitted from each light-emitting device 300 may display a color different from the light emitted from one or more adjacent light-emitting devices 300. For example, the light-emitting layer 320 of each light-emitting device 300 may include a material different from the light-emitting layer 320 of an adjacent light-emitting device 300. The light-emitting layer 320 of each light-emitting device 300 may be spaced away from the light-emitting layer 320 of the adjacent light-emitting device 300. For example, the light-emitting layer 320 of each light-emitting device 300 may include an end which is disposed on the bank insulating layer 160.

A voltage applied to the upper electrode 330 of each light-emitting device 300 may be the same as a voltage applied to the upper electrode 330 of adjacent light-emitting device 300. For example, the upper electrode 330 of each light-emitting device 300 may be electrically connected to the upper electrode 330 of adjacent light-emitting device 300. The upper electrode 330 of each light-emitting device 300 may include the same material as the upper electrode 330 of adjacent light-emitting device 300. For example, the upper electrode 330 of each light-emitting device 300 may be formed simultaneously with the upper electrode 330 of adjacent light-emitting device 300.

Each of the upper electrodes 330 may have a block shape, as shown in FIG. 2. The upper electrodes 330 which are separated from each other may be arranged in a first direction D1 and a second direction D2 perpendicular to the first direction D1. Each of the upper electrodes 330 may overlap a plurality of the emission areas EA. For example, each of the upper electrodes 330 may include first electrode regions 330a and a second electrode region 330b, as shown in FIG. 3. Each of the first electrode regions 330a may include a portion overlapping with the emission areas EA. The second electrode region 330b may be disposed outside the emission areas EA. One of the first electrode regions 330a may be disposed on the light-emitting layer 320 of each light-emitting device 300. The second electrode region 330b may be disposed on the non-emission area NEA of the device substrate 100. For example, the second electrode region 330b may be disposed on the bank insulating layer 160, as shown in FIG. 4.

The second electrode region 330b may be separated from the first electrode regions 330a. For example, separating partitions 175 may be disposed between the first electrode regions 330a and the second electrode region 330b. Each of the separating partitions 175 may have a side of reverse taper. For example, the separating partition 175 may have width along an axis parallel to a major surface of the device substrate 100 that decreases with proximity to the device substrate 100, as illustrated in FIG. 4. Thus, in the touch display apparatus according to the embodiment of the present disclosure, the first electrode regions 330a and the second electrode region 330b of each upper electrode 330 may be simultaneously formed without an additional patterning process. For example, the first electrode regions 330a and the second electrode region 330b of each upper electrode 330 may include the same material. An electrode pattern 330p including the same material as the first electrode regions 330a and the second electrode region 330b may be disposed on an upper surface of each separating partition 175 opposite to the device substrate 100. The separating partitions 175 may be disposed on the bank insulating layer 160. Each of the separating partitions 175 may extend between one of the first electrode regions 330a and the second electrode region 330b. For example, each of the separating partitions 175 may surround one of the emission areas EA. A size of each first electrode region 330a may be larger than a size of the corresponding emission area EA. Each of the first electrode regions 330a may be surrounded by the second electrode region 330b. Therefore, in the touch display apparatus according to the embodiment of the present disclosure, the process efficiency may be improved.

The separating partitions 175 may include an insulating material. For example, the separating partitions 175 may include an organic insulating material. Each of the separating partitions 175 may have a multi-layer structure. For example, each of the separating partitions 175 may have a stacked structure of layers which have an etch selectivity.

First link wires 550 may be disposed between the lower planarization layer 140 and the upper planarization layer 150. The first electrode regions 330a of each upper electrode 330 may be electrically connected to one of the first link wires 550. For example, the upper planarization layer 150 and the bank insulating layer 160 may include first electrode contact holes exposing a portion of each first link wire 550.

Each of the first electrode regions 330a may include a portion overlapping with one of the first electrode contact holes. For example, each of the first electrode regions 330a may be in direct contact with the corresponding first link wire 550 through one of the first electrode contact holes. The first link wire 550 may extend in the first direction D1, as illustrated in FIG. 3. For example, each of the first electrode regions 330a may be connected to the same first link wire 550 as the first electrode region 330a which is disposed adjacent to the corresponding first electrode region 330a in the first direction D1.

The first link wires 550 may include a conductive material. For example, the first link wires 550 may include a metal, such as aluminum (Al), titanium (Ti), copper (Cu), chrome (Cr), molybdenum (Mo) and tungsten (W). The first link wires 550 may include the same material as the intermediate electrodes 510. The first link wires 550 may be insulated from the intermediate electrodes 510. For example, the first link wires 550 may be spaced away from the intermediate electrodes 510 in the second direction.

Second link wires 520 may be disposed between the lower planarization layer 140 and the upper planarization layer 150. The second link wires 520 may include a conductive material. For example, the second link wires 520 may include a metal, such as aluminum (Al), titanium (Ti), copper (Cu), chrome (Cr), molybdenum (Mo) and tungsten (W). The second link wires 520 may include the same material as the intermediate electrodes 510 and the first link wires 550. The second link wires 520 may extend parallel to the first link wires 550. For example, the second link wires 520 may extend in the first direction D1, as shown in FIG. 3. The second link wires 520 may be spaced away from the intermediate electrodes 510 and the first link wires 550 in the second direction D2.

Each of the second link wires 520 may be electrically connected to the second electrode region 330b of one of the upper electrodes 330, as shown in FIG. 3 and FIG. 4. For example, the upper planarization layer 150 and the bank insulating layer 160 may include second electrode contact holes exposing a portion of each second link wire 520. The second electrode region 330b of each upper electrode 330 may include a portion overlapping with one of the second link wires 520. For example, the second electrode region 330b of each upper electrode 330 may be in direct contact with the corresponding second link wire 520 through one of the second electrode contact holes. Thus, in the touch display apparatus according to the embodiment of the present disclosure, a signal applied to the second electrode region 330b of each upper electrode 330 may be different from a signal applied to the first electrode regions 330a of the corresponding upper electrode 330. For example, in the touch display apparatus according to the embodiment of the present disclosure, the driving parts DD, SD, TD and TC may include a touch sensing part TD for sensing the touch of the user and/or the tool, and the second link wires 520 may be electrically connected to the touch sensing part TD. The first link wires 550 may be electrically connected to the power voltage supply source. That is, in the touch display apparatus according to the embodiment of the present disclosure, a power voltage may be applied to the first electrode regions 330a of each upper electrode 330 which are disposed on the light-emitting layer 320 of each light-emitting device 300, and the touch of the user and/or the tool may be sensed by using the second electrode region 330b of each upper electrode 330. Therefore, in the touch display apparatus according to the embodiment of the present disclosure, realizing the image by the light-emitting devices 300 and sensing the touch of the user and/or the tool may be performed, simultaneously.

An encapsulating element 400 may be disposed on the upper electrodes 330 and the separating partitions 175. The encapsulating element 400 may prevent the damage of the light-emitting devices 300 due to the external impact and moisture. The encapsulating element 400 may have a multi-layer structure. For example, the encapsulating element 400 may include a first encapsulating layer 410, a second encapsulating layer 420 and the third encapsulating layer 430, which are sequentially stacked. The first encapsulating layer 410, the second encapsulating layer 420 and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may include an inorganic insulating material, and the second encapsulating layer 420 may include an organic insulating material. Thus, in the touch display apparatus according to the embodiment of the present disclosure, the damage of the light-emitting devices 300 due to the external impact and moisture may be effectively prevented. The second electrode region 330b used for sensing the touch of the user, the tool or both is also protected from damage due to external impact, moisture or both by the encapsulating layer 420. A thickness difference due to the light-emitting devices 300 and the separating partitions 175 may be removed by the second encapsulating layer 420. For example, an upper surface of the encapsulating element 400 opposite to the device substrate 100 may be a flat surface. The side of each separating partition 175 having reverse taper may be covered by the encapsulating element 400.

Accordingly, the touch display apparatus according to the embodiment of the present disclosure may sense the touch of the user and/or the tool by using the upper electrode 330 of each light-emitting device 300, which is disposed between the device substrate 100 and the encapsulating element 400. Thus, in the touch display apparatus according to the embodiment of the present disclosure, a process of forming touch electrodes and touch lines (e.g., on the encapsulating element 400) may be omitted. Therefore, in the touch display apparatus according to the embodiment of the present disclosure, the process efficiency may be improved, and a size of a bezel area may be minimized or reduced.

The touch display apparatus according to the embodiment of the present disclosure is described that realizing the image and sensing the touch are simultaneously performed. However, in the touch display apparatus according to another embodiment of the present disclosure, the first electrode regions 330a of each upper electrode 330 may be selectively connected to the touch sensing part TD by the first link wires 550. That is, in the touch display apparatus according to another embodiment of the present disclosure, both of the first electrode regions 330a and the second electrode region 330b of each upper electrode 330 may be used as touch electrodes. For example, in the touch display apparatus according to another embodiment of the present disclosure, each frame may be divided into a display period and a touch period. During the display period of each frame, the power voltage may be supplied to the first electrode regions 330a of each upper electrode 330. During the touch period of each frame, a touch sensing signal Rx may be applied to the first electrode regions 330a and the second electrode region 330b of each upper electrode 330. A touch driving signal Tx may be applied to the second electrode region 330b of each upper electrode 330. Thus, in the touch display apparatus according to another embodiment of the present disclosure, the accuracy of touch sensing may be improved.

Figure 5:
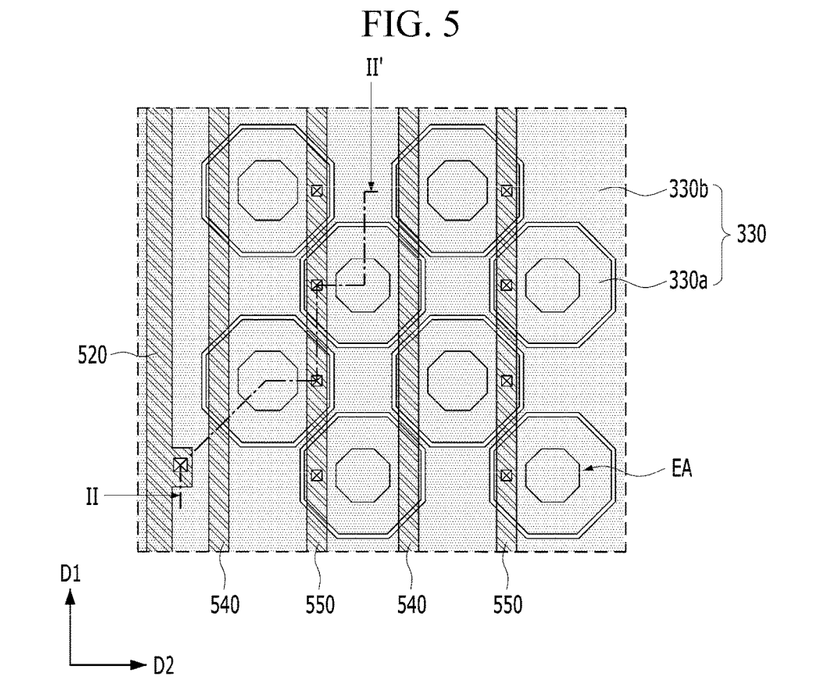
FIGS. 5 to 9 are views showing the touch display apparatus according another embodiment of the present disclosure.
Figure 6:
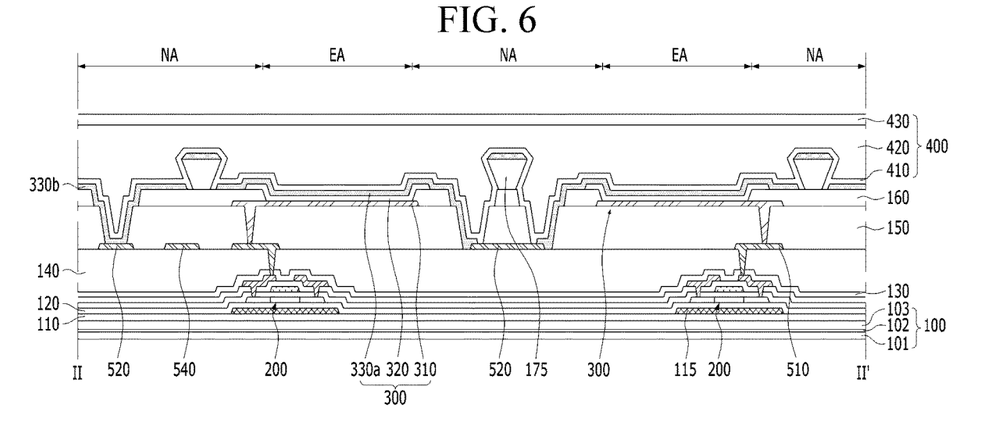

The touch display apparatus according to the embodiment of the present disclosure is described that the touch of the user and/or the tool is sensed by self-capacitance method. However, the touch display apparatus according to another embodiment of the present disclosure may sense the touch of the user and/or the tool using mutual-capacitance method. FIG. 5 is a view of the R region in accordance with another embodiment. FIG. 6 is a view taken along II-II' of FIG. 5. For example, as illustrated in FIGS. 5 and 6, the touch display apparatus according to another embodiment of the present disclosure may include signal wires 540 which are disposed between the first link wires 550 and the second link wires 520. The signal wires 540 may be spaced away from the first link wires 550 and the second link wires 520. The signal wires 540 may include a conductive material. For example, the signal wires 540 may include a metal, such as aluminum (Al), titanium (Ti), copper (Cu), molybdenum (Mo) and tungsten (W). The signal wires 540 may include the same material as the first link wires 550 and the second link wires 520. For example, the signal wires 540 may be disposed between the lower planarization layer 140 and the upper planarization layer 150. Each of the signal wires 540 may include a portion overlapping with the second electrode region 330b of each upper electrode 330. For example, the signal wires 540 may extend parallel to the first link wires 550 and the second link wires 520. The signal wires 540 may transmit a specific signal. For example, the signal wires 540 may be a power voltage supply line providing a power voltage to each driving circuit. The signal wires 540 may be selectively connected to the touch sensing part. For example, the touch sensing signal may be selectively applied to the sensing wires 540. Thus, the touch display apparatus according to another embodiment of the present disclosure may sense the touch of the user and/or the tool by the second electrode region 330b of each upper electrode 330 and the signal wires 540. Therefore, in the touch display apparatus according to another embodiment of the present disclosure, the upper electrodes 330 may have various shapes.

Figure 7:
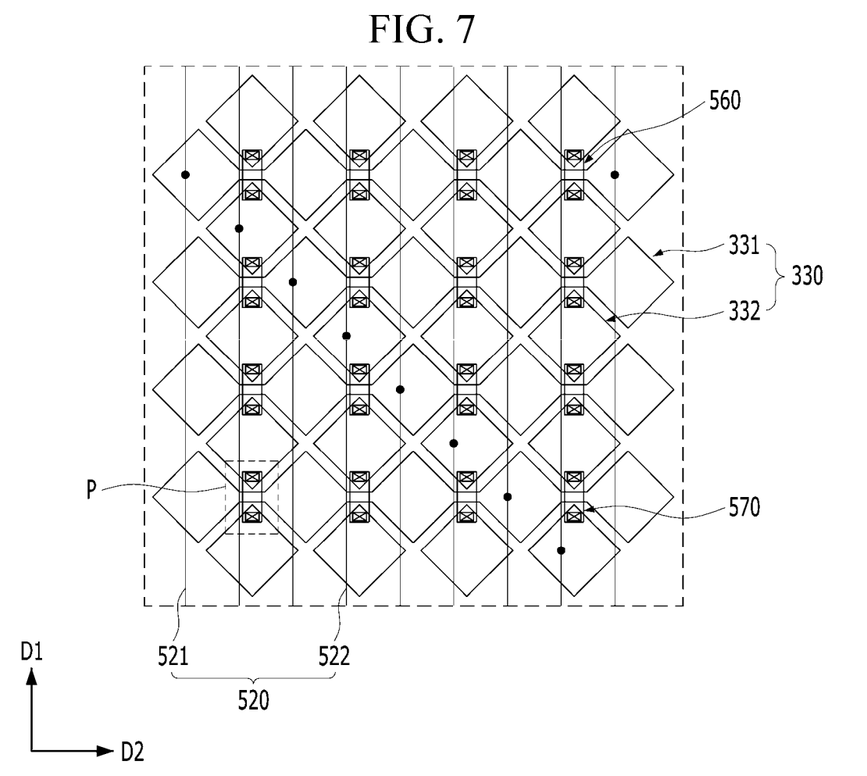
Figure 8:
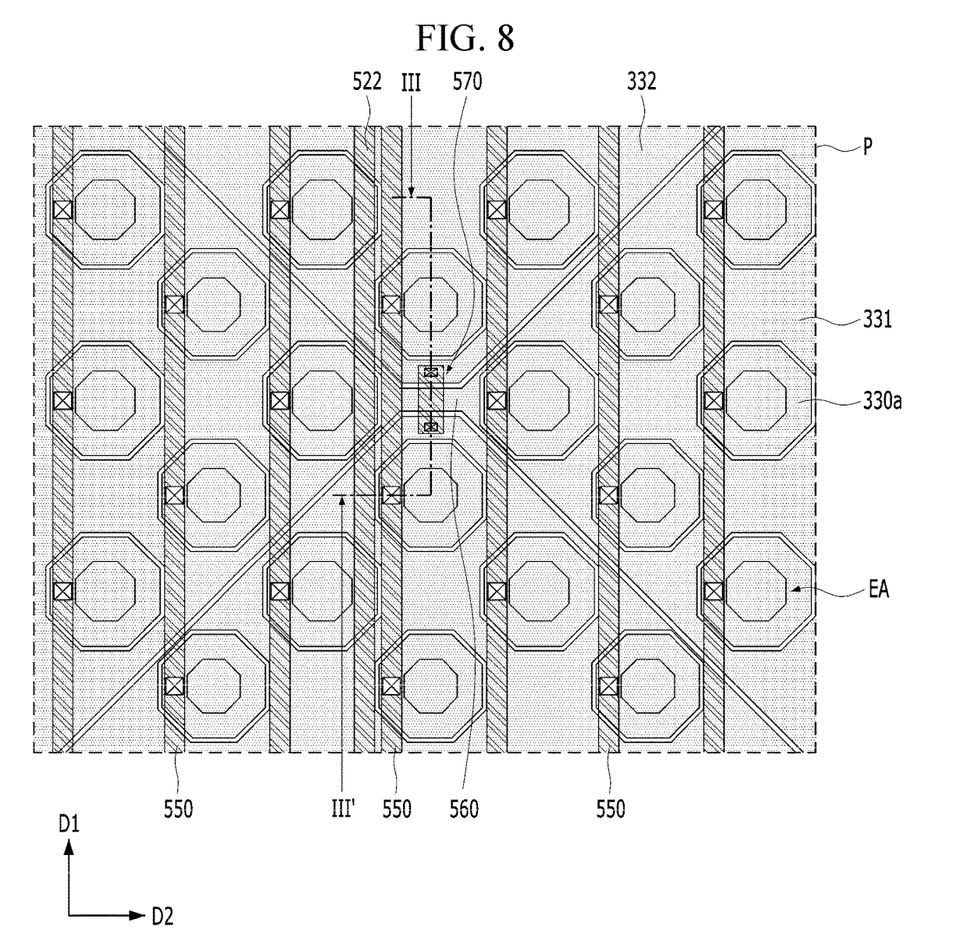
Figure 9:
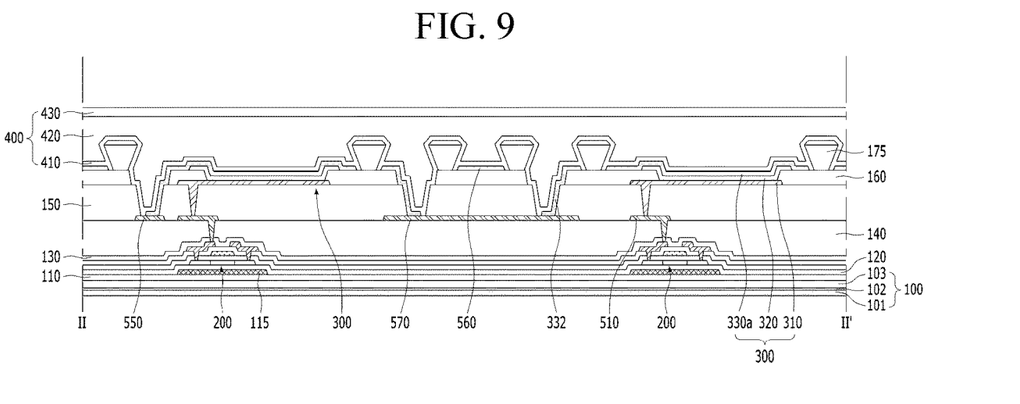

In the touch display apparatus according to another embodiment of the present disclosure, the upper electrodes 330 may include first upper electrodes 331 which are connected in the second direction D2 by first bridge electrodes 560 and second upper electrodes 332 which are connected in the first direction D1 perpendicular to the second direction D2 by second bridge electrodes 570, as shown in FIGS. 7 to 9. FIG. 7 is a view illustrating the first upper electrodes 331 and the second upper electrodes 332. FIG. 8 is an enlarged view of P region of FIG. 7. FIG. 9 is a view taken along III-III' of FIG. 8. Each of the first upper electrodes 331 and the second upper electrodes 332 may include the first electrode regions 330a overlapping with the emission areas EA and the second electrode region 330b separated from the first electrode regions 330a, as illustrated in FIG. 8. For example, the second electrode region 330b of each first upper electrode 331 may be connected to the second electrode region 330b of one or two other first upper electrodes 331 adjacent to the first upper electrode 331 in the second direction D2. For example, the second electrode region 330b of each second upper electrode 332 may be connected to the second electrode region 330b of one or two other second upper electrodes 332 adjacent to the second upper electrode 332 in the first direction D1. The first bridge electrodes 560 and the second bridge electrodes 570 may include a conductive material. Each of the second bridge electrodes 570 may cross one of the first bridge electrodes 560. For example, the second bridge electrodes 570 may include a material different from the first bridge electrodes 560. For example, the second bridge electrodes 570 may be between the first bridge electrodes 560 and the device substrate 100, such that the first bridge electrodes 560 cross "over" the second bridge electrodes 570.

The first bridge electrodes 560 may be disposed on the same layer as the first upper electrodes 331, as illustrated in FIG. 9. For example, each of the first upper electrodes 331 may be in direct contact with one of the first bridge electrodes 560. The first bridge electrodes 560 may include the same material as the first upper electrodes 331. For example, each of the first bridge electrodes 560 may be a transparent electrode formed by a transparent conductive material, such as ITO and IZO. The first bridge electrodes 560 may be disposed on the non-emission area NEA of the device substrate 100. For example, the first bridge electrodes 560 may be disposed outside the emission areas EA. The first bridge electrodes 560 may be formed with the first upper electrodes 331, such that the second electrode regions 330b of the first upper electrodes 331 on either side of the first bridge electrodes 560 form a continuous, unbroken layer with the first bridge electrodes 560, with no visible interface therebetween, as illustrated in FIG. 8.

The second bridge electrodes 570 may be disposed on a layer different from the first bridge electrodes 560, as illustrated in FIG. 9. The second bridge electrodes 570 may be disposed on the same layer as the first link wires 550 and the second link wires 520. For example, the second bridge electrodes 570 may be disposed between the lower planarization layer 140 and the upper planarization layer 150. The second bridge electrodes 570 may include a metal, such as aluminum (Al), titanium (Ti), copper (Cu), molybdenum (Mo) and tungsten (W). For example, the second bridge electrodes 570 may include the same material as the first link wires 550 and the second link wires 520. The second bridge electrodes 570 may be disposed outside the emission areas EA. The second bridge electrodes 570 may be spaced away from the first link wires 550 and the second link wires 520.

Each of the second link wires 520 may include first wire lines 521 connected to one of the first upper electrodes 331 and second wire lines 522 connected to one of the second upper electrodes 332, as illustrated in FIG. 7. Each of the first wire lines 521 may be connected to one of the first upper electrodes 331, which are connected in the second direction D2 by the first bridge electrodes 560. Each of the second wire lines 522 may be connected to one of the second upper electrodes 332, which are connected in the first direction D1 by the second bridge electrodes 570. A signal applied to the second wire lines 522 may be different from a signal applied to the first wire lines 521. For example, the touch driving signal Tx may be applied through the first wire lines 521, and the touch sensing signal Rx may be applied through the second wire lines 522. Thus, in the touch display apparatus according to another embodiment of the present disclosure, the number of the second link wires 520 for sensing the touch may be reduced. That is, in the touch display apparatus according to another embodiment of the present disclosure, an area occupied by the second link wires 520 may be minimized or reduced. Therefore, in the touch display apparatus according to another embodiment of the present disclosure, the resolution may be improved.

In the result, the touch display apparatus according to the embodiments of the present disclosure may comprise the light-emitting devices, wherein each of the light-emitting device may include a pixel electrode, a light-emitting layer and an upper electrode, which are sequentially stacked, wherein the upper electrode of each light-emitting device may include the first electrode region overlapping with the light-emitting layer and the second electrode region being separated from the first electrode region, and wherein the second electrode region may be connected to the link wire different from the first electrode region. Thus, the touch display apparatus according to the embodiments of the present disclosure may sense the touch of the user and/or the tool by the first electrode region and/or the second electrode region of the upper electrode. That is, in the touch display apparatus according to the embodiments of the present disclosure, a process of forming touch electrodes and touch lines on the encapsulating element covering the light-emitting device may be omitted. Thereby, in the touch display apparatus according to the embodiments of the present disclosure, the process of forming components for sensing the touch may be simplified, and an area of a bezel area may be reduced.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display apparatus comprising:
a device substrate;
a driving transistor on the device substrate, the driving transistor including a semiconductor pattern, a gate electrode, a drain electrode and a source electrode;
a lower planarization layer on the driving transistor;
an upper planarization layer on the lower planarization layer;
a pixel electrode on an emission area of the device substrate, the pixel electrode being on the upper planarization layer;
an intermediate electrode contacting the driving transistor and the pixel electrode, the intermediate electrode being disposed on a surface of the lower planarization layer and below the upper planarization layer;
a bank insulating layer on the device substrate, the bank insulating layer covering an edge of the pixel electrode;
a light-emitting layer on a portion of the pixel electrode which is exposed by the bank insulating layer;
an upper electrode on the light-emitting layer, and including a first electrode region and a second electrode region which is spaced away from the first electrode region, the first electrode region including a portion overlapping the light-emitting layer;
an encapsulating element on the upper electrode;
a first link wire disposed between the device substrate and the bank insulating layer, the first link wire being electrically connected to the first electrode region; and a second link wire being spaced away from the first link wire, the second link wire being electrically connected to the second electrode region;

a first contact hole that extends fully through the upper planarization layer to expose an upper surface of the lower planarization layer and an upper surface of the first link wire;

a second contact hole that extends fully through the bank insulating layer and overlaps the first contact hole;

wherein the first electrode region extends into the second contact hole and the first contact hole, is in direct contact with the upper surface of the lower planarization layer and is in direct contact with the upper surface of the first link wire;

wherein the first link wire and the second link wire are disposed in a same layer as the intermediate electrode.

2. The touch display apparatus according to claim 1, further comprising a separating partition on the bank insulating layer,
wherein the separating partition has a side of reverse taper, and
wherein the separating partition is disposed between the first electrode region and the second electrode region.

3. The touch display apparatus according to claim 2, wherein the separating partition surrounds the emission area of the device substrate.

4. The touch display apparatus according to claim 1, wherein the first electrode region of the upper electrode has a larger size than the emission area of the device substrate.

5. The touch display apparatus according to claim 1, wherein the second electrode region includes the same material as the first electrode region.

6. The touch display apparatus according to claim 1, wherein the second link wire is disposed between the device substrate and the bank insulating layer, and wherein the first link wire and the second link wire include the same material.

7. The touch display apparatus according to claim 1, further comprising a signal wire being spaced away from the first link wire and the second link wire,
wherein the signal wire is insulated from the upper electrode, and
wherein the signal wire includes a portion overlapping with the second electrode region.

8. The touch display apparatus according to claim 7, wherein the signal wire is disposed on the same layer as the first link wire.

9. The touch display apparatus of claim 1, wherein the intermediate electrode, the first link wire and the second link wire are between the lower planarization layer and the upper planarization layer.

10. The touch display apparatus of claim 9, wherein the first electrode region is in direct contact with a sidewall of the bank insulating layer exposed by the second contact hole and a sidewall of the upper planarization layer exposed by the first contact hole.

11. The touch display apparatus of claim 9, further comprising a first encapsulation layer on the first electrode region, the first encapsulation layer extending into the first contact hole and being in direct contact with the upper surface of the first link wire.

12. A touch display apparatus comprising:
a device substrate;
a lower planarization layer on the device substrate;
an upper planarization layer on the lower planarization layer;
a bank insulating layer on the upper planarization layer, the bank insulating layer laterally surrounding emission areas;
pixel electrodes, each of the pixel electrodes being disposed on one of the emission areas of the device substrate, each of the pixel electrodes extending into the upper planarization layer;
light-emitting layers, each of the light-emitting layers being disposed on one of the pixel electrodes;
upper electrodes on the bank insulating layer and the light-emitting layers, the upper electrodes being disposed side by side in a first direction and side by side in a second direction, the second direction being perpendicular to the first direction;
an encapsulating element on the upper electrodes;
first link wires disposed between the lower planarization layer and the upper planarization layer, the first link wires extending in the first direction;
second link wires disposed between the lower planarization layer and the upper planarization layer, the second link wires being spaced away from the first link wires;
a first contact hole that extends fully through the upper planarization layer to expose an upper surface of the lower planarization layer and an upper surface of one of the first link wires;
a second contact hole that extends fully through the bank insulating layer and overlaps with the first contact hole; and
a first encapsulation layer that extends into the first contact hole and is in direct contact with the one of the first link wires;
wherein one of the upper electrodes includes a cathode electrode and a touch electrode that are spaced away from each other,
wherein the cathode electrode extends into the first contact hole and the second contact hole and is in direct contact with the one of the first link wires and the upper surface of the lower planarization layer, and
wherein the touch electrode is connected to one of the second link wires.

13. The touch display apparatus according to claim 12, wherein the second link wires extend parallel to the first link wires, and wherein the first link wires and the second link wires are disposed outside the emission areas.

14. The touch display apparatus according to claim 12, wherein the upper electrodes include:
first upper electrodes connected to each other in the second direction by first bridge electrodes; and
second upper electrodes connected to each other in the first direction by second bridge electrodes;
wherein the first bridge electrodes and the second bridge electrodes are disposed outside the emission areas, and
wherein each of the second bridge electrodes crosses one of the first bridge electrodes.

15. The touch display apparatus according to claim 14, wherein the second link wires include:
first wire lines, each of the first wire lines being connected to the second electrode region of a respective first upper electrode; and
second wire lines, each of the second wire lines being connected to the second electrode region of a respective second upper electrode.

16. The touch display apparatus according to claim 14, wherein the second bridge electrodes are disposed on the same layer as the first link wires and the second link wires.

17. The touch display apparatus according to claim 16, wherein the second bridge electrodes include the same material as the first link wires and the second link wires.

18. The touch display apparatus according to claim 14, wherein each of the first upper electrodes is in direct contact with one of the first bridge electrodes.

\* \* \* \* \*